United States Patent
Ogawa

(10) Patent No.: US 11,227,781 B2
(45) Date of Patent: Jan. 18, 2022

(54) SUBSTRATE STORAGE CONTAINER

(71) Applicant: Shin-Etsu Polymer Co., Ltd., Tokyo (JP)

(72) Inventor: Osamu Ogawa, Saitama (JP)

(73) Assignee: Shin-Etsu Polymer Co., Ltd., Tokyo (JP)

(*) Notice: Subject to any disclaimer, the term of this patent is extended or adjusted under 35 U.S.C. 154(b) by 0 days.

(21) Appl. No.: 16/763,994

(22) PCT Filed: Sep. 18, 2018

(86) PCT No.: PCT/JP2018/034524
§ 371 (c)(1),
(2) Date: May 14, 2020

(87) PCT Pub. No.: WO2019/097832
PCT Pub. Date: May 23, 2019

(65) Prior Publication Data
US 2020/0279761 A1 Sep. 3, 2020

(30) Foreign Application Priority Data
Nov. 15, 2017 (JP) .............................. JP2017-219818

(51) Int. Cl.
*H01L 21/673* (2006.01)
(52) U.S. Cl.
CPC .............................. *H01L 21/67386* (2013.01)
(58) Field of Classification Search
CPC .................................................. B65D 21/386
USPC .................. 206/710–712, 832; 220/623, 669
See application file for complete search history.

(56) References Cited

U.S. PATENT DOCUMENTS

| | | | | |
|---|---|---|---|---|
| 4,917,251 A * | 4/1990 | Favre | ................. | A47G 19/2205 |
| | | | | 215/371 |
| 5,520,014 A * | 5/1996 | Laugier | .................... | A23G 9/08 |
| | | | | 62/457.2 |
| 5,769,266 A * | 6/1998 | Willbrandt | ............. | B65D 1/265 |
| | | | | 220/669 |
| 6,761,041 B2 * | 7/2004 | Roth | ......................... | F25D 3/08 |
| | | | | 62/371 |

(Continued)

FOREIGN PATENT DOCUMENTS

| | | |
|---|---|---|
| JP | H11208766 | 8/1999 |
| JP | 2001298079 | 10/2001 |

(Continued)

OTHER PUBLICATIONS

"International Search Report (Form PCT/ISA/210) of PCT/JP2018/034524," dated Dec. 4, 2018, with English translation thereof, pp. 1-4.

*Primary Examiner* — Chun Hoi Cheung
(74) *Attorney, Agent, or Firm* — JCIP Global Inc.

(57) ABSTRACT

The present disclosure provides a substrate storage container equipped with a container main body that has an opening portion formed by an opening frame at a front surface and is capable of storing a plurality of substrates and a lid that closes the opening portion. The container main body is of a box-like shape having the opening frame, a rear wall, a right wall, a left wall, a top wall, and a bottom wall. Each of the walls has a thickness which is thinner at a side toward the opening frame at the front surface than at a side toward the rear wall.

11 Claims, 6 Drawing Sheets

(56) References Cited

U.S. PATENT DOCUMENTS

| | | | | |
|---|---|---|---|---|
| 6,959,830 | B1* | 11/2005 | Kanou | B65D 1/0223 |
| | | | | 215/40 |
| 8,733,571 | B2* | 5/2014 | Zajtai | A47K 5/12 |
| | | | | 220/4.26 |
| 9,370,888 | B2* | 6/2016 | Zajtai | B29C 45/1657 |
| D766,040 | S* | 9/2016 | Kehrein | D7/523 |
| 10,566,225 | B2* | 2/2020 | Gallagher | H01L 21/67366 |
| 2001/0042697 | A1 | 11/2001 | Kajima et al. | |
| 2012/0103860 | A1 | 5/2012 | Masuko et al. | |
| 2013/0327781 | A1* | 12/2013 | Yi | B65D 1/40 |
| | | | | 220/669 |

FOREIGN PATENT DOCUMENTS

| | | |
|---|---|---|
| JP | 2007332271 | 12/2007 |
| JP | 2011018771 | 1/2011 |
| JP | 2012099800 | 5/2012 |
| JP | 2013157374 | 8/2013 |

* cited by examiner

SUBSTRATE STORAGE CONTAINER

CROSS-REFERENCE TO RELATED APPLICATION

This application is a 371 application of the International PCT application serial no. PCT/JP2018/034524, filed on Sep. 18, 2018, which claims the priority benefits of Japan Patent Application No. 2017-219818, filed on Nov. 15, 2017. The entirety of each of the above-mentioned patent applications is hereby incorporated by reference herein and made a part of this specification.

BACKGROUND OF THE INVENTION

Technical Field

The present invention is related to a Substrate Storage Container that stores a plurality of substrates.

Related Art

Substrate storage container store substrates such as semiconductor wafers in an internal space, and are utilized to store the substrates in a warehouse, during conveyance among semiconductor processing apparatuses, for transport among factories, etc. These substrate storage container are constituted by a container main body which has an opening portion and a lid for sealing the opening portion. Between these components, the container main body is formed by injection molding.

In the case that the container main body is injection molded, one or a plurality of gates are provided on a side toward a rear wall side which is opposite the opening portion in order to inject resin thereinto (refer to Patent literature 1 and Patent literature 2). In addition, in molded products which are formed by injection molding, each wall that constitutes the container main body has a constant thickness in order to equalize shrinkage during cooling and to suppress warpage and sink points.

LITERATURE OF RELATED ART

Patent Literature

Patent literature 1: Japanese Patent Laid-Open No. H11-208766
Patent literature 2: Japanese Patent Laid-Open No. 2007-332271

SUMMARY

Problems to be Solved

However, if the walls that constitute the container main body are formed with a constant thickness, the time that a resin material arrives at a molding position differs between that at the vicinity of the gate (in the vicinity of the rear wall) and an end remote from the gate (in the vicinity of an opening frame). Therefore, the thickness of a skin layer which is generated with the lapse of time varies. As a result, differences in the distribution of residual stress after cooling of a molded article is completed become likely to be generated, and there is a possibility that warpage or deformation may occur.

The present invention has been developed in view of the foregoing problem. It is an object of the present invention to provide a substrate storage container having a shape which is capable of improving the dimensional stability of a container main body.

Means to Solve Problems (1) One aspect of the present invention is a substrate storage container which is equipped with a container main body having an opening formed by an opening frame on a front surface and is capable of storing a plurality of substrates, and a lid that closes the opening, wherein the container main body is a box-like shape that includes the opening frame, a rear wall, a right wall, a left wall, a top wall, and a bottom wall, and each of the walls has a thinner thickness toward a side of the opening frame than a thickness toward a side of the rear wall.

(2) In the aspect of (1) above, each of the walls may have a thickness which is reduced in a stepwise manner from the side of the rear wall to the side of the opening frame.

(3) In the aspect of (2) above, each of the walls may have a thickness which is reduced in a stepwise manner within a range of greater than or equal to 0.5 mm and less than or equal to 1.5 mm from the side of the rear wall to the side of the opening frame.

(4) In the aspect of (1) above, each of the walls may have a thickness which is gradually reduced from the side of the rear wall to the side of the opening frame so as to have a non-uniform thickness without portions at which stepwise reductions in thickness are implemented.

(5) In any one of the aspects of (1) through (4) above, the opening frame and each of the walls may have a maximum thickness portion having a thickness of greater than or equal to 3 mm and less than or equal to 7 mm.

(6) In any one of the aspects of (1) through (5) above, the opening frame and each of the walls may have a minimum thickness portion having a thickness of greater than or equal to 0.5 mm and less than or equal to 2 mm.

(7) In any one of the aspects of (1) through (6) above, the opening frame may be a separate component from the container main body, which is integrated with the container main body.

(8) In any one of the aspects of (1) through (7) above, the opening frame may have a thickness which is thinner than the thickness of each of the walls.

Effect

According to the present invention, a substrate storage container having a shape which is capable of improving the dimensional stability of a container main body can be provided.

DESCRIPTION OF EMBODIMENTS

Figure 1:
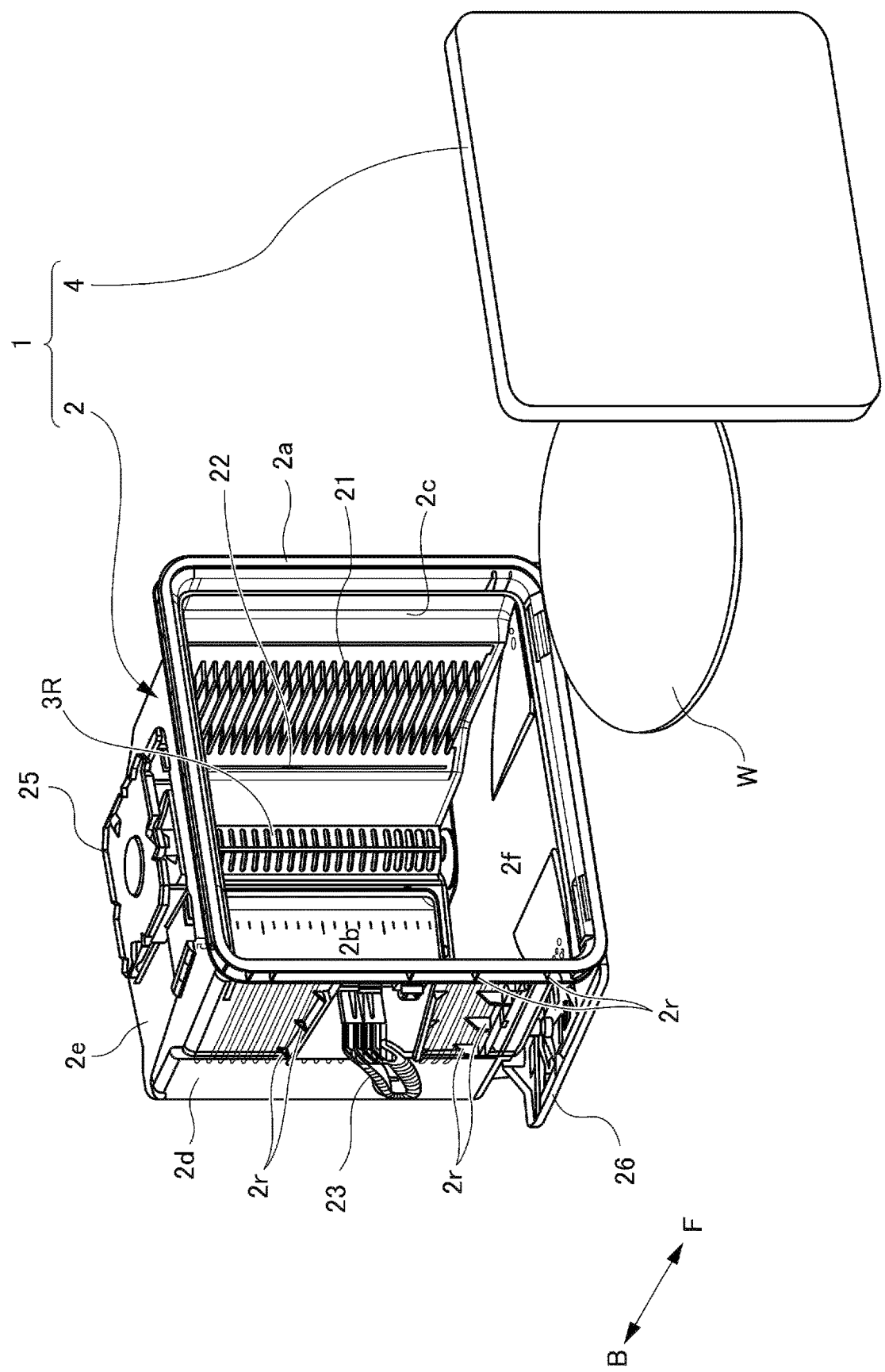
FIG. 1 is an exploded perspective view that illustrates a substrate storage container according to an embodiment of the present invention.

Hereinafter, embodiments of the present invention will be described in detail with reference to the attached drawings. Throughout the embodiments of the present specification, the same members are denoted by the same reference numerals and symbols. In addition, in the drawings, the direction of a front F (opening frame 2*a*) and the direction of a back B (rear wall 2*b*) are indicated by solid arrows. Further, the left and right directions refer to those in a state viewed from the front F.

Figure 2:
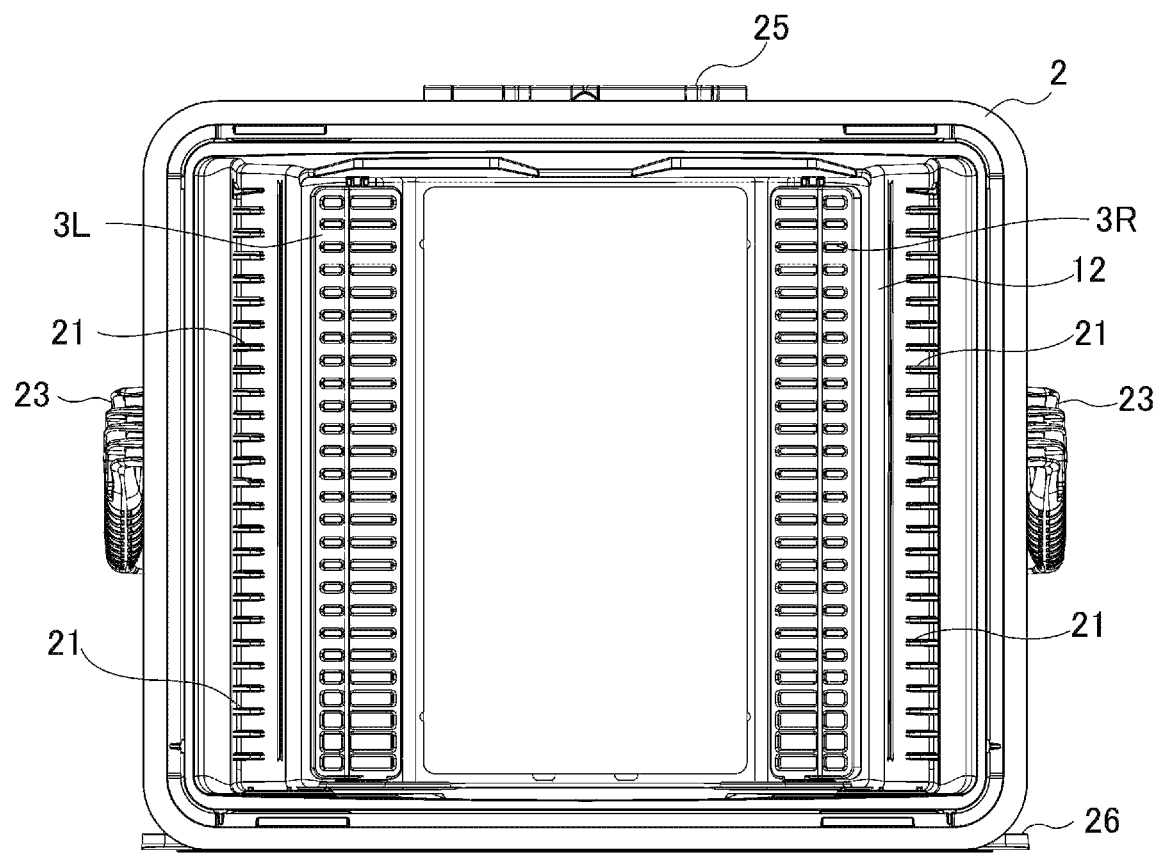
FIG. 2 is a front view that illustrates a container main body of the embodiment.
Figure 3:
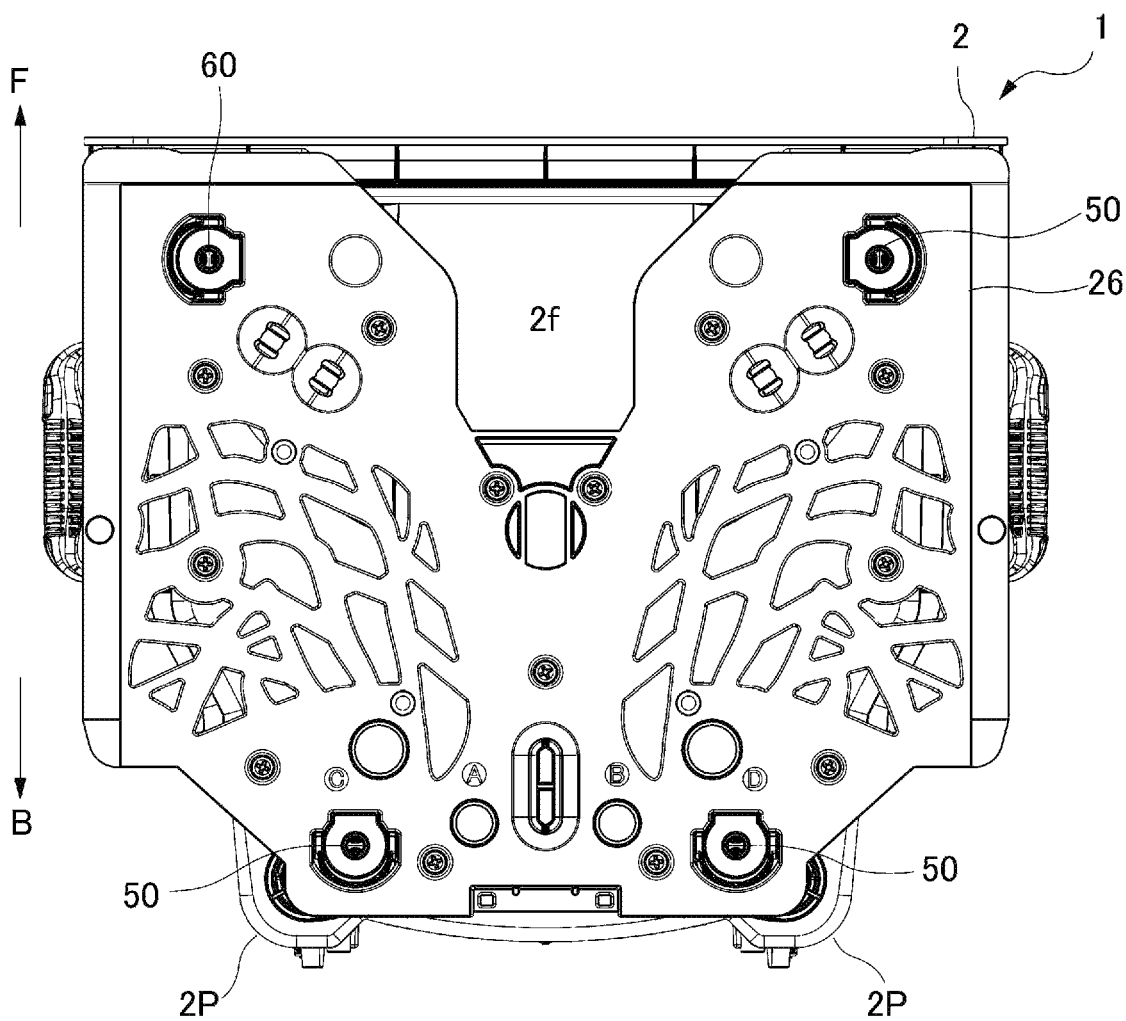
FIG. 3 is a bottom view that illustrates the container main body of the embodiment.

First, the general outline of a substrate storage container 1 will be described. FIG. 1 is an exploded perspective view that illustrates the substrate storage container 1 according to an embodiment of the present invention. FIG. 2 is a front view that illustrates a container main body 2 of the embodiment. FIG. 3 is a bottom view that illustrates the container main body 2 of the embodiment.

The substrate storage container 1 which is illustrated in FIG. 1 is equipped with a container main body 2 that stores a plurality of substrates W, and a lid 4 which is removably attached to an opening portion of the container main body 2. The substrates W which are stored in the substrate storage container 1 are semiconductor wafers or mask glasses having a diameter of 300 mm or 450 mm.

The container main body 2 is of a box shape that includes an opening frame 2*a* that forms the opening portion at the front surface F, a rear wall 2*b*, a right wall 2*c*, a left wall 2*d*, a top wall 2*e*, and a bottom wall 2*f*. The container main body 2 is that of the so called front open box type.

The lid 4 is that which is attached to the opening portion of the opening frame 2*a*, and a seal gasket (not illustrated) is attached on the lid 4 such that it faces the opening frame 2*a* of the container main body 2. When the lid 4 is attached to the container main body 2, the seal gasket is in close contact with a peripheral portion between the container main body 2 and the lid 4, and is configured to maintain the airtightness of an internal space of the substrate storage container 1.

In addition, the lid 4 is formed by overlapping a housing and a cover plate, and a latch (locking) mechanism (not shown) which is capable of protruding and retracting is provided in the interior therebetween. The latch mechanism is provided to enable automatic opening/closing operations by a lid opening/closing device, and the lid 4 is locked onto to the container main body 2 by a protruding portion of the latch protruding. The latch mechanism is provided at two locations on each of the upper and lower sides of the lid 4.

A locking portion such as an opening for engaging the protruding portion of the latch is formed in the opening frame 2*a* of the container main body 2 at positions corresponding to those of the latch mechanism.

Protruding portions 2P that protrude further to the back B are formed on both the left and right sides of the rear wall 2*b* (refer to FIG. 3). The protruding portions 2P function as legs when the container main body 2 is placed with the opening portion of the front surface F facing upward.

In addition, scale marks or the like that assist in ascertaining the number of substrates W which are stored are provided at the center of the exterior surface of the rear wall 2*b* of the container main body 2 (refer to FIG. 1).

Further, grips 23 that function during griping operations are respectively attached to the container main body 2 in the vicinities of the centers of the exterior surfaces of the right wall 2 and the left wall 2*d*.

In addition, a plurality of left and right support pieces 21 for supporting the substrates W which are stored in a horizontal orientation are respectively provided on the interior surfaces of the right wall 2*c* and the left wall 2*d* of the container main body 2. Position restricting portions 22 that restrict the positions to which the substrates W are inserted when the substrates are inserted toward the back B are provided toward the side of the back B on the interior surfaces of the right wall 2*c* and the left wall 2*d*.

The pairs of left and right support pieces 21 are arranged at a predetermined pitch in the vertical direction, and each support piece 21 is formed in an elongated plate shape that supports the peripheral edges of the substrates W. In the embodiment, the support pieces 21 are provided such that 25 pieces of substrates W are capable of being supported. However, the maximum number of substrates W which are capable of being supported is not limited to 25.

These support pieces 21 are formed at the same time when the right wall 2*c* or the left wall 2*d* is molded. Alternatively, the support pieces 21 may be formed as separate components with respect to the right wall 2*c* and the left wall 2*d* and then attached to the right wall 2*c* or the left wall 2*d* by being fitted or the like, or the support pieces 21 may be integrally formed by insert molding.

A top flange 25 such as a robotic flange is attached to the exterior of the top wall 2*e* of the container main body 2. The top flange 25 is gripped by, for example, a ceiling transport vehicle in a semiconductor manufacturing factory, to convey the substrate storage container 1 among processing steps, and are also utilized for positioning a lid opening/closing device of a semiconductor processing device or the like.

Three gas supply members 50 and one gas exhaust member 60 are provided on the bottom wall 2*f* of the container main body 2, as illustrated in FIG. 3. The gas supply members 50 and the gas exhaust member 60 enable gas to flow from the exterior of the substrate storage container 1 to the internal space thereof, or from the internal space to the exterior. The gas supply members 50 and the gas exhaust member 60 function to suppress deterioration of the surfaces of the substrates W and to eliminate pressure differences between the internal space of the substrate storage container 1 and the exterior.

Among these, two of the gas supply members 50 are provided on both the left and right sides on the bottom wall 2*f* toward the back B. In addition, one of the gas supply members 50 and the one gas exhaust member 60 are provided on the bottom wall 2*f* at the left side or the right side in the vicinity of the front surface F. Various functional units for changing the environment of the internal space of the substrate storage container 1, for example, gas replacement units 3R and 3L, valve units, sealing units, small diameter filter units, large diameter filter units, etc. are connected to the gas supply members 50. Note that the arrangement and the numbers of the gas supply members 50 and the gas exhaust member 60 are not limited to those which are illustrated in FIG. 3. For example, the gas supply members 50 in the vicinity of the front surface F may be utilized as the gas exhaust member 60. In addition, the gas supply members 50 and the gas exhaust member 60 may be provided the lid 4 in some cases.

The gas replacement units 3R and 3L replace the gas within the internal space of the container main body 2. Therefore, the gas replacement units 3R and 3L are provided on both the left and right sides at the back B of the container main body (the rear wall 2b or in the vicinity of the protruding portions) such that they do not interfere with the substrate W even in a state where the substrate W is inserted (refer to FIGS. 1 and 2).

A plurality of outlet apertures for blowing gas into the interior space of the container main body 2 are provided in the gas replacement units 3R and 3L in the vertical direction such that gas is blown in three directions. However, the directions in which the gas replacement units 3R and 3L blow gas is not limited to this configuration, and may be a single direction toward the side of the lid 4 side, or all directions excluding the vertical direction (toward the top wall 2e and the bottom wall 2f). As a further alternative, the two gas replacement units 3R and 3L may not be provided at two positions at the left and the light, and may be a functional unit which is linked in a planar manner across substantially the total surface of the back B of the container main body 2 (the rear wall 2b or the vicinity of the protruding portions). Examples of the gas to be blown into the interior space of the container main body include an inert gas and dry air. Further, examples of the inert gas include nitrogen gas and argon gas. Nitrogen gas is preferable from the viewpoint of cost.

In addition, a bottom plate 26 for positioning and placing the container main body 2 is attached to the exterior surface of the bottom wall 2f of the container main body 2.

In addition to the above, the opening frame 2a, the rear wall 2b, the right wall 2c, the left wall 2d, the top wall 2e, and the bottom wall 2f of the container main body 2 are provided with reinforcing ribs 2r which are illustrated (refer to the external surface of the left wall 2d in FIG. 1) or not illustrated are provided at appropriate locations.

The container main body 2 and accessory components such as the lid 4, the grip 23, the top flange 25, and the bottom plate 26 may be formed by injection molding a molding material that contains a required resin, or may be configured by combinations of a plurality of injection molded parts. Examples of the resin which is contained in the molding material include thermoplastic resins such as polycarbonate, a cycloolefin polymer, polyether imide, polyether ketone, polyether ether ketone, polybutylene terephthalate, polyacetal, and a liquid crystal polymer, as well as alloys thereof.

In addition, a conductive substance such as carbon fiber, carbon powder, carbon nanotubes, and a conductive polymer, or various antistatic agents such as anions, cations, and nonionics may be added to these resins as necessary. Further, an ultraviolet ray absorbing agent, a reinforcing fiber for improving rigidity, etc. may also be added as necessary.

Note that the container main body 2, the lid 4, the grip 23, the top flange 25, the bottom plate 26, and the like may be transparent, opaque, or translucent. However, it is preferable for at least a portion of one of the container main body 2 and the lid 4 to be transparent. For example, the rear wall 2b may have a transparent window formed of a nonconductive material. This transparent window may be integrally molded by insert molding when the container main body 2 is molded.

Figure 4:
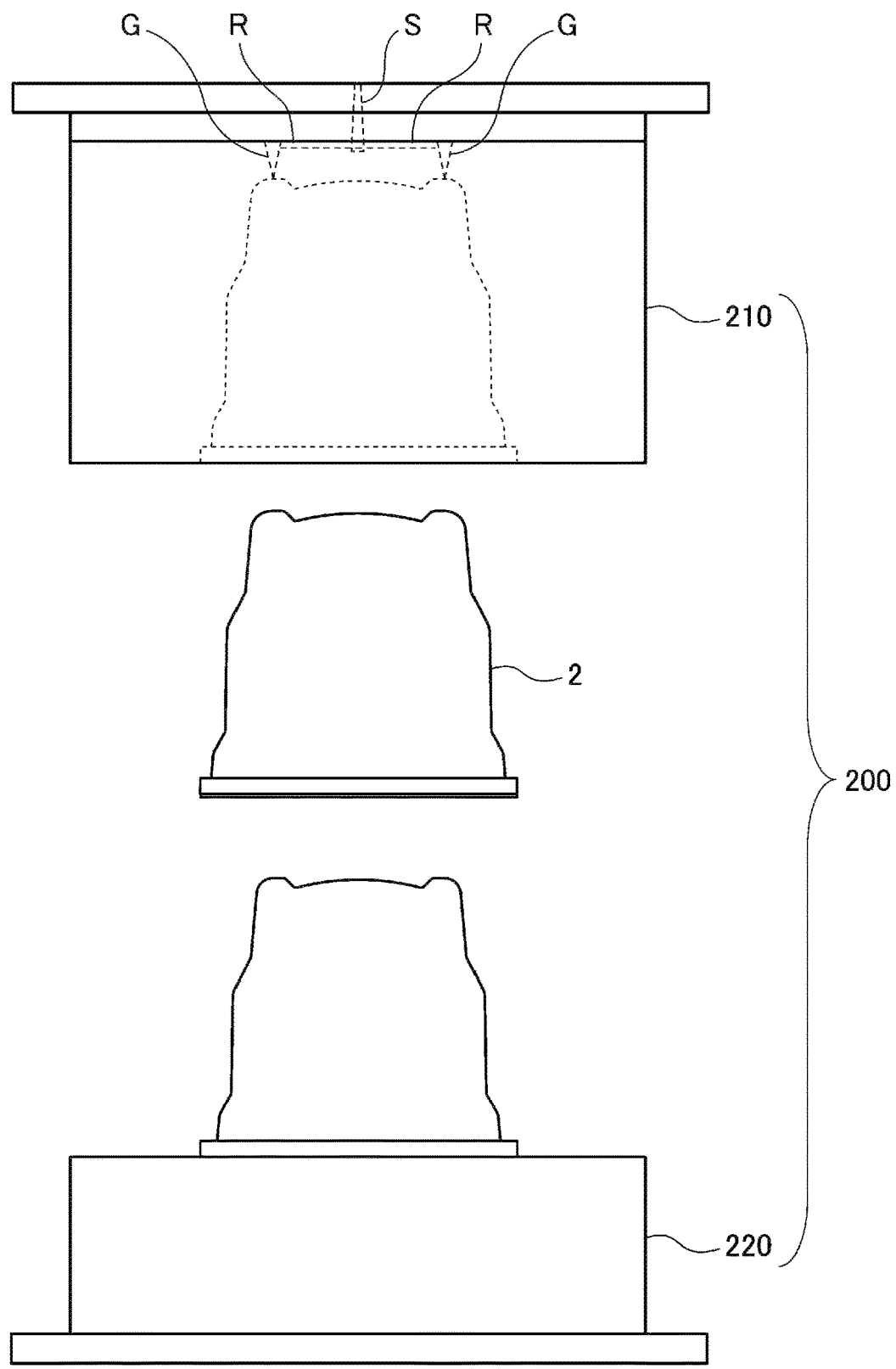
FIG. 4 is a schematic diagram that illustrates a mold which is employed for injection molding.

Here, a method for producing the container main body 2 by injection molding using a mold 200 that includes a concave mold 210 and a convex mold 220 will be described briefly. FIG. 4 is a schematic view that illustrates the mold 200 which is employed for injection molding.

The container main body 2 is molded by injection molding using the mold 200 that includes the concave mold 210 and the convex mold 220. In this mold 200 for injection molding, a plastic resin is caused to pass through a molding cavity for the container main body 2 which is formed between the concave mold 210 and the convex mold 220 from an injecting nozzle (not illustrated) via a sprue S, runners R, and gates G, as illustrated in FIG. 4.

The gates G are respectively provided in the vicinities of the top wall 2e and the bottom wall 2f in the left and right protruding portions 2P formed on the rear wall 2b. However, the number of gates G is not limited to four. For example, the number of gates G may be two at the left and right, provided at a midpoint position in the vertical direction that connects the top wall 2e and the bottom wall 2f in the left and right protruding portions 2P. As a further alternative, a single gate G may be provided at the center portion of the rear wall 2b in the horizontal and vertical directions.

Note that the gates G are not those which are connected to the injection nozzle via the sprue S and the runners R, but may be sprue gates (direct gates) which are directly connected to the injection nozzle, or valve gates that control opening and closing operations of gates which are directly connected to the injection nozzle by with valve rods (to adjust the degree of openness of the directly connected gates).

Figure 5:
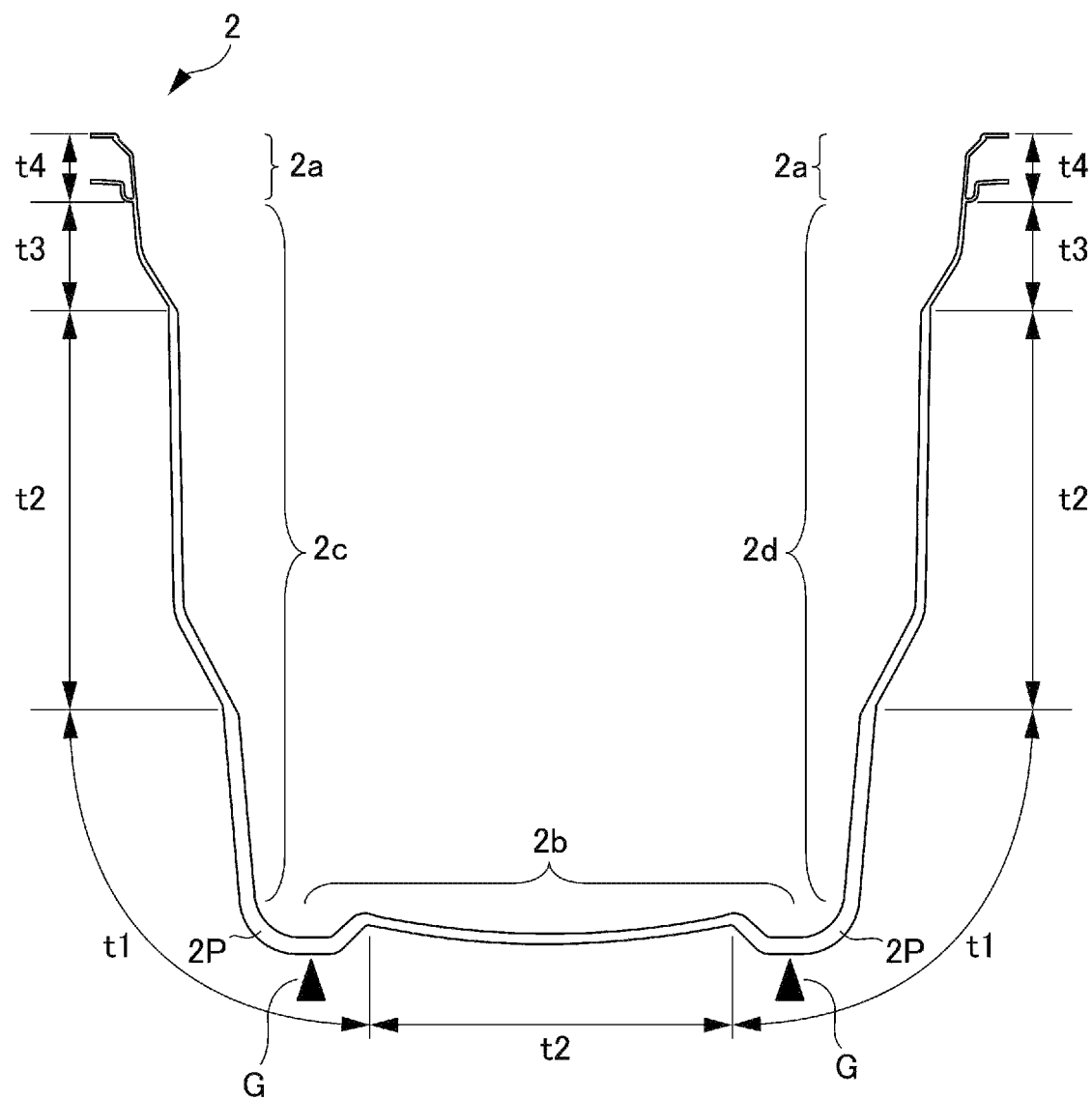
FIG. 5 is a schematic horizontal cross sectional diagram that illustrates the states of thicknesses of each wall and an opening frame in the embodiment.
Figure 6:
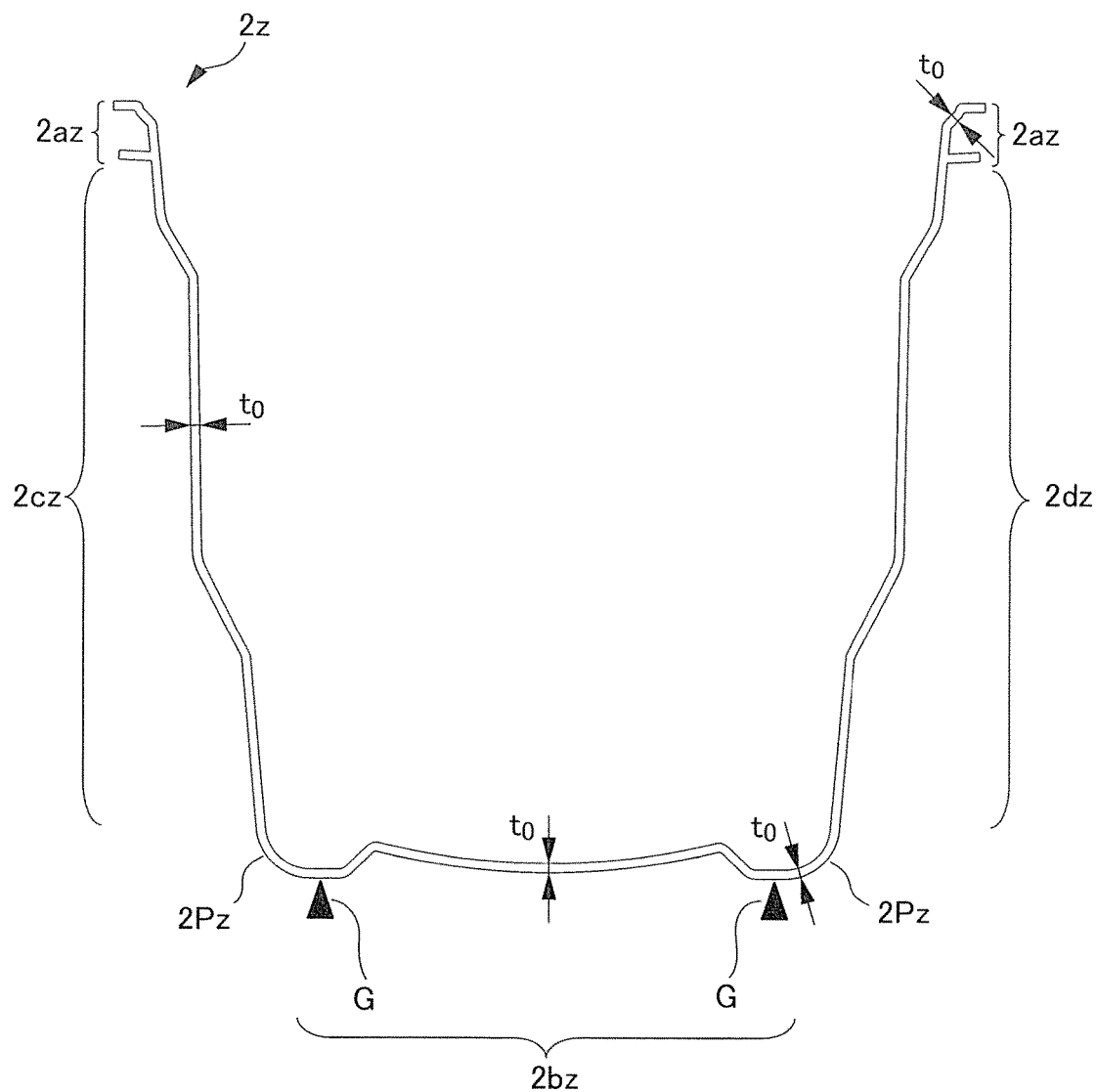
FIG. 6 is a schematic horizontal cross sectional diagram that illustrates the states of thicknesses of each wall and an opening frame in a conventional container main body.

Next, the thickness of each of the walls 2b through 2f and the opening frame 2a that constitute the container main body 2 will be described. FIG. 5 is a schematic horizontal cross sectional diagram that illustrates the states of thicknesses of each of the walls 2b through 2f and the opening frame 2a in the embodiment. FIG. 6 is a schematic horizontal sectional view showing the state of the wall thickness of each of walls 2bz through 2fz and an opening frame 2az of a conventional container main body.

In the rear wall 2b, a region of the protruding portions 2P in the vicinity of the gate G is a first thickness portion t1, and a space between the protruding portions 2P is a second thickness portion t2. The rear wall 2b also has the same respective thicknesses in the vertical direction that connects the top wall 2e and the bottom wall 2f.

However, in the case that a transparent window is insert molded in the rear wall 2b, the thickness of only the transparent window may be different from t2 (for example, the thickness of the transparent window may be the same as that of the first thickness portion t1), or may be the same as that of the second thickness portion t2 about the periphery of the transparent window.

In the right wall 2c, the left wall 2d, the top wall 2e, and the bottom wall 2f, regions from the rear wall 2b to vicinity of the ends of the support pieces 21 (not illustrated) toward the side of the back B are first thickness portions t1.

In addition, in the right wall 2c, the left wall 2d, the top wall 2e, and the bottom wall 2f, regions from to vicinity of the ends of the support pieces 21 toward the side of the back B to the vicinity of the ends toward the side of the front surface F are second thickness portions t2. However, because the support pieces 21 are not formed on the top wall 2e and the bottom wall 2f, which are not illustrated in FIG. 5, the regions of the top wall 2e and the bottom wall 2f which are the second thickness portions t2 are those for a case in which the support pieces 21 are projected in the vertical direction.

Further, regions of the right wall 2c, the left wall 2d, the top wall 2e, and the bottom wall 2f from the vicinity of the ends of the support pieces 21 toward the side of the front surface F to the opening frame 2a are third thickness portions t3.

The opening frame 2a is a fourth thickness portion t4.

Here, the thickness of the first thickness portions t1 is greater than the thickness of the second thickness portions t2, the thickness of the second thickness portions t2 is greater than the thickness of the third thickness portions t3, and the thickness of the third thickness portions t3 is greater than the thickness of the fourth thickness portion t4. In addition, each portion at which the stepwise reduction in thickness is implemented such as that between the first thickness portions t1 and the second thickness portions t2 is linear (that is, in each of the thickness portions t1 through t4, the thickness is constant in a direction perpendicular to the surface of the drawing sheet of FIG. 5).

In other words, each of the walls 2b through 2f has a thinner thickness toward the side of the opening frame 2a side on the front surface F than the thickness thereof toward the side of the rear wall 2b. The opening frame 2a has a thinner thickness than the thickness of each of the walls 2b through 2f. Note that although the reinforcing ribs 2r which are provided on the container main body 2 basically have the same thickness as the thicknesses of the thickness portions t1 through t4 of the opening frame 2a and the walls 2b through 2f, the thickness of the ribs 2r may be thinner than the thicknesses of the thickness portions t1 through t4 of the opening frame 2a and the walls 2b through 2f, in order to prevent the generation of sink points.

Note that in the present embodiment, each of the walls 2b through 2f has a four stage thickness which is reduced in a stepwise manner from the first thickness portion t1 to the fourth thickness portion t4. However, the thickness of the walls 2b through 2f may be a two stage thickness, a three stage thickness, or a five or more stage thickness. In addition, the thickness of the first thickness portion t1, which is a maximum thickness portion, is preferably within a range of greater than or equal to 3 mm and less than or equal to 7 mm, and the thickness of the fourth thickness portion t4, which is a minimum thickness portion, is preferably within a range of greater than or equal to 0.5 mm and less than or equal to 2.5 mm. For example, the thickness of the first thickness portion t1 may be 5 mm, the thickness of the second thickness portion t2 may be 4 mm, the thickness of the third thickness portion t3 may be 3 mm, and the thickness of the fourth thickness portion t4 may be 2.5 mm. In this manner, it is not necessary for the thickness difference between adjacent stages to be 1 mm in all cases, and the thickness may be reduced within a range of greater than or equal to 0.5 mm and less than or equal to 1.5 mm at each stepwise reduction.

In addition, the positions and the thicknesses of each of the thickness portions t1 through t4 in the right wall 2c, the left wall 2d, the top wall 2e, and the bottom wall 2f, the positions are preferably the same. However, the support pieces 21, the grips 23, the top flange 25, the bottom plate 26, etc. are provided at the interior and exterior of the container main body 2 as described above. Therefore, although the right wall 2c and the left wall 2d are horizontally symmetrical, they differ among each of the walls 2c through 2f. Accordingly, the positions and thicknesses of the thickness portions t1 through t4 may be different from each other. Further, portions of the rear wall 2b, the right wall 2c, the left wall 2d, the top wall 2e, and the bottom wall 2f which are thickened in order to provide the support pieces 21, the grips 23, the top flange 25, the bottom plate 26, etc. may be maintained at the thicknesses which are set therefor, without being reduced in thickness.

Particularly, if a liquid crystal polymer is employed as the molding material of the container main body 2, the thinner the wall thickness, the greater the proportion of a skin layer having a high orientation of polymer chains will be, and the higher the strength per unit cross-sectional area becomes. Therefore, even if the opening frame 2a and each of the walls 2b through 2f are formed with a thickness of 3 mm to 0.5 mm, a sufficient strength can be obtained for the container main body 2.

In addition, the wall thicknesses of the walls 2bz through 2fz and the opening frame 2az that constitute the conventional container main body 2z are all constant at to, as illustrated in FIG. 6.

As described above, the substrate storage container 1 according to the embodiment of the present invention is equipped with the container main body 2 having the opening formed by the opening frame 2a on a front surface and is capable of storing a plurality of substrates W, and a lid 4 that closes the opening, the container main body 2 being of a box shape that includes the opening frame 2a, the rear wall 2b, the right wall 2c, the left wall 2d, the top wall 2e, and the bottom wall 2f, each of the walls 2b through 2f having a thinner thickness toward the side of the opening frame 2a than a thickness toward the side of the rear wall 2b. Thereby, fluidity of resin is improved, such that the resin does not enter from the side of the opening frame even in the case that the support pieces 21 are integrally molded with the right wall 2c and the left wall 2d. As a result, no welds are formed on the external surfaces of the right wall 2c and the left wall 2d at positions corresponding to the support pieces 21. Because the welds are not formed, high temperature gas will not accumulate and the mold 200 will not corrode.

In addition, in each of the walls 2b through 2f, the thickness toward the side of the opening frame 2a at the front surface F which is the end remote from the gates G than the thickness toward the side of the rear wall 2b at the back B in the vicinity of the gates G. Therefore, the fluidity of resin is improved during injection, and it is possible to reduce a pressure difference between the vicinity of the gate G and the vicinity of the leading end of the opening frame 2a in the mold 200 at the time of molding. For this reason, the difference in residual stress throughout the entire container main body 2 is reduced, and warpage and deformation of the container main body 2 can be minimized.

Further, if the pressure difference between the vicinity of the gate G and the vicinity of the opening frame 2a becomes small, a holding pressure which is applied to the resin in the mold 200 at the time of molding also acts uniformly. As a result, the dimensions and shape of the container main body 2 become highly accurate, and the accuracy becomes stable. Thereby, the amount of cooling time for a molded article (container main body 2) can be set to approach uniformity (to be constant) for various positions. If the amount of cooling time can be set to be uniform, the amount of cooling time can be reduced compared to the conventional container main body 2z which has a constant thickness. If the cooling time during molding can be reduced, such a reduction will lead to an improvement in productivity.

Additionally, the walls have thinner thicknesses at the side toward the opening frame 2a than toward the side of the rear wall 2b. Therefore, the weight at the side toward the opening frame 2a can be reduced, and the center of gravity of the container main body 2 can be brought closer to the side toward the rear wall 2b (toward the center). If the center of gravity of the container main body 2 is toward the side of the rear wall 2b, the center of gravity of the substrate storage container 1 will also approach the side of the rear wall 2b. Therefore, even if the heavy lid 4 is attached to the container main body 2, it will be difficult for the side toward the opening frame 2a (lid 4) to face downward, and the orientation of the substrate storage container 1 can be stabilized when the substrate storage container 1 is conveyed by a conveyance device or a robot.

In the embodiment, each of the walls 2b through 2f has a thickness which is reduced in a stepwise manner from the side toward the rear wall 2b to the side toward the opening frame 2a. In addition, in the embodiment, each of the walls 2b through 2f has a thickness which is reduced in a stepwise matter in increments within a range of greater than or equal to 0.5 mm and less than or equal to 1.5 mm from the side toward the rear wall 2b to the side toward the opening frame 2a (for example, the differences before and after each step are combinations of 1 mm, 0.5 mm and 1.0 mm). Thereby, the processing accuracy of the mold 200 that includes the concave mold 210 and the convex mold 220 for molding the container main body 2 can be improved.

In the embodiment, each of the walls 2b through 2f has a thickness which is reduced from the side of the rear wall 2b to the side of the opening frame 2a so as to have a non-uniform thickness without stepped portions. Thereby, the number of portions where stress is concentrated in each of the walls 2b through 2f is reduced, and the strength of the container main body 2 can be improved.

In the embodiment, the opening frame 2a and each of the walls 2b through 2f has a maximum thickness portion of greater than or equal to 3 mm and less than or equal to 7 mm. Thereby, the strength of the container main body 2 can be improved, and weight reduction can be achieved.

In the embodiment, the minimum thickness portion of the opening frame 2a and each of the walls 2b through 2f is greater than or equal to 0.5 mm and less than or equal to 2 mm. Thereby, the strength of the container main body 2 can be maintained, and weight reduction can be achieved.

In the embodiment, the opening frame 2a has a thickness which is thinner than the thickness of each of the walls 2b through 2f. Thereby, the weight of the opening frame 2a can be reduced, and the center of gravity of the substrate storage container 1 can be made to approach a direction toward the center. Therefore, conveyance and transport of the substrate storage container 1 can be stabilized.

A preferred embodiment of the present invention has been described in detail. However, the present invention is not limited to the embodiment described above, and various modifications and changes are possible within the scope of the present invention as recited in the claims.

(Modification)

In the embodiment described above, each portion at which the stepwise reduction in thickness is implemented such as that between the first thickness portion t1 and the second thickness portion t2 in each of the walls 2b through 2f is of a linear-like shape. Alternatively, the portions at which the stepwise reduction in thickness is implemented may be in the shape of a convex arc. Thereby, the fluidity (flow velocity) of resin can be made more uniform.

In the embodiment described above, each of the walls 2b through 2f has a wall thickness which is reduced from the side toward the rear wall 2b to the side toward the opening frame 2a. Alternatively, the thicknesses of the walls may be gradually reduced so as to have a non-uniform thickness without portions at which stepwise reductions in thickness are implemented. The rate at which the thicknesses are reduced may be linear or a curve. That is, it is only necessary for the thickness of each of the walls 2b through 2f to be reduced from the side toward the rear wall 2b to the side toward the opening frame 2a.

In the embodiment described above, the opening frame 2a is formed in the container main body 2 by injection molding together with the walls 2b through 2f. However, the opening frame 2a may be formed as a separate component different from the container main body 2, and then integrated with the container main body 2 which is constituted by the rear wall 2b, the right wall 2c, the left wall 2d, the top wall 2e, and the bottom wall 2f by insert molding. By forming the opening frame 2a as a separate component from the container main body 2, the thickness of the opening frame 2a can be designed independent of the thickness of each of the walls 2b through 2f. Therefore, the opening frame 2a may be formed to have a thicker thickness than the thicknesses of the walls 2b through 2f. For this reason, the strength of the opening frame 2a can be further improved.

The invention claimed is:

1. A substrate storage container comprising:
   a container main body having an opening formed by an opening frame on a front surface and configured to store a plurality of substrates; and
   a lid configured to be removably attached to the opening; wherein
   the container main body is a box-like shape that includes the opening frame, a rear wall, a right wall, a left wall, a top wall, and a bottom wall; and
   each of the walls has a thickness which is reduced in a stepwise manner from a side of the rear wall to a side of the opening frame or each of the walls has a thickness which is gradually reduced from the side of the rear wall to the side of the opening frame so as to have a non-uniform thickness without a step.

2. The substrate storage container as defined in claim 1, wherein
   each of the walls has a thickness which is reduced in a stepwise manner within a range of greater than or equal to 0.5 mm and less than or equal to 1.5 mm from the side of the rear wall to the side of the opening frame.

3. The substrate storage container as defined in claim 1, wherein
   the opening frame and each of the walls have a maximum thickness portion having a thickness of greater than or equal to 3 mm and less than or equal to 7 mm.

4. The substrate storage container as defined in claim 1, wherein
   the opening frame and each of the walls have a minimum thickness portion having a thickness of greater than or equal to 0.5 mm and less than or equal to 2 mm.

5. The substrate storage container as defined in claim 1, wherein
   the opening frame is a separate component from the container main body, which is integrated with the container main body.

6. The substrate storage container as defined in claim 1, wherein
   the opening frame has a thickness which is thinner than the thickness of each of the walls.

7. The substrate storage container as defined in claim 1, wherein the rear wall comprises:
   protrusions protruding rearward, having a first thickness and formed at an end portion of the rear wall adjacent to the right wall and an end portion of the rear wall adjacent to the left wall; and
   a second thickness portion having a second thickness smaller than the first thickness and formed between the protrusions.

8. The substrate storage container as defined in claim 7, wherein each of the right wall, the left wall, the top wall, and the bottom wall comprises:
   a rear end portion having the first thickness; and a second thickness portion having the second thickness and formed on the front side of the corresponding rear end portion.

9. The substrate storage container as defined in claim 8, wherein
in each of the right wall, the left wall, the top wall, and the bottom wall further, a front end portion having a third thickness smaller than the second thickness is further formed on a front side of the corresponding second thickness portion.

10. The substrate storage container as defined in claim 1, wherein each of the right wall, the left wall, the top wall, and the bottom wall comprises:
a rear end portion having a first thickness; and
a second thickness portion having a second thickness smaller than the first thickness and formed on a front side of the rear end portion.

11. The substrate storage container as defined in claim 10, wherein
in each of the right wall, the left wall, the top wall, and the bottom wall, a front end portion having a third thickness smaller than the second thickness is further formed on a front side of the corresponding second thickness portion.

* * * * *